United States Patent
Menard

(10) Patent No.: US 9,070,738 B2
(45) Date of Patent: Jun. 30, 2015

(54) SCR COMPONENT WITH TEMPERATURE-STABLE CHARACTERISTICS

(71) Applicant: STMicroelectronics (Tours) SAS, Tours (FR)

(72) Inventor: Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 14/494,692

(22) Filed: Sep. 24, 2014

(65) Prior Publication Data

US 2015/0084094 A1 Mar. 26, 2015

(30) Foreign Application Priority Data

Sep. 26, 2013 (FR) .................................... 13 59295

(51) Int. Cl.
*H01L 29/74* (2006.01)
*H01L 29/16* (2006.01)
*H01L 29/66* (2006.01)
*H01L 21/02* (2006.01)
*H01L 21/322* (2006.01)
*H01L 29/08* (2006.01)
*H01L 21/306* (2006.01)

(52) U.S. Cl.
CPC ............. *H01L 29/74* (2013.01); *H01L 29/16* (2013.01); *H01L 29/66363* (2013.01); *H01L 21/02532* (2013.01); *H01L 21/02664* (2013.01); *H01L 21/3221* (2013.01); *H01L 29/0834* (2013.01); *H01L 21/306* (2013.01)

(58) Field of Classification Search
CPC . H01L 29/74–29/749; H01L 29/083–29/0839; H01L 29/87; H01L 29/66363–29/66401; H01L 27/1027; H01L 27/0817; H01L 2924/1301–2924/13035; H01L 21/306–21/3063
See application file for complete search history.

(56) References Cited

U.S. PATENT DOCUMENTS

| 4,016,017 A * | 4/1977 | Aboaf et al. ................. 438/441 |
| 4,180,416 A * | 12/1979 | Brock ............................ 438/441 |
| 4,546,367 A * | 10/1985 | Schutten et al. ............. 257/331 |
| 4,772,926 A * | 9/1988 | Nishizawa et al. .......... 257/136 |
| 2005/0127470 A1* | 6/2005 | Akiyama et al. ............. 257/506 |
| 2005/0253170 A1* | 11/2005 | Akiyama ...................... 257/211 |
| 2011/0101416 A1* | 5/2011 | Schulze et al. .............. 257/139 |
| 2014/0077284 A1* | 3/2014 | Akiyama et al. ............ 257/302 |

FOREIGN PATENT DOCUMENTS

EP   0035841 A2   9/1981

OTHER PUBLICATIONS

INPI Search Report and Written Opinion for FR1359295 dated Jun. 11, 2014 (9 pages).
Gupta et al: "Technologies for porous silicon devices", Semiconductor Science and Technology, vol. 10, No. 5, May 1995 (5 pages).

* cited by examiner

*Primary Examiner* — Steven J Fulk
(74) *Attorney, Agent, or Firm* — Gardere Wynne Sewell LLP

(57) ABSTRACT

An SCR-type component of vertical structure has a main upper electrode formed on a silicon region of a first conductivity type which is formed in a silicon layer of a second conductivity type. The silicon region is interrupted in first areas where the material of the silicon layer comes into contact with the upper electrode, and is further interrupted in second areas filled with resistive porous silicon extending between the silicon layer and the main upper electrode.

12 Claims, 5 Drawing Sheets

SCR COMPONENT WITH TEMPERATURE-STABLE CHARACTERISTICS

CROSS REFERENCE TO RELATED APPLICATIONS

This application claims the priority benefit of French Patent application number 1359295, filed on Sep. 26, 2013, which is hereby incorporated by reference to the maximum extent allowable by law.

TECHNICAL FIELD

The present disclosure relates to SCR-type components of vertical structure and to the manufacturing of such components.

BACKGROUND

SCR-type components are components having a structure including a stack of at least four semiconductor layers and/or regions of alternated conductivity types. Such components are, for example, thyristors, triacs, unidirectional or bidirectional Shockley diodes.

FIGS. 1A and 1B respectively are a top view and a cross-section view of an example of a thyristor. FIG. 1B is a cross-section view along broken line B-B of FIG. 1A. These drawings schematically show the thyristor comprising a vertical stack of four semiconductor layers and/or regions 3, 5, 7, and 9 having alternated conductivity types, respectively PNPN.

Heavily-doped N-type region 9 (N+) is formed in P-type doped layer 7. A cathode metallization 11 covers region 9. A gate metallization 13 covers a central portion 14 of layer 7. An anode metallization 15 covers the lower surface of layer 3. Metallizations 11, 13, and 15 respectively form a cathode electrode K, a gate electrode G, and an anode electrode A.

Region 9 is interrupted in areas 17 where cathode metallization 11 comes into contact with layer 7. Areas 17 are currently called emitter short-circuits or emitter short-circuit holes. Such emitter short-circuits 17 are known to improve the dV/dt behavior of the thyristor, thus decreasing the risk of untimely turning-on of the thyristor by voltage peaks.

In FIG. 2, two curves 20 and 22 respectively illustrate the temperature dependence T of turn-on current $I_{GT}$ and of hold current $I_H$ in a thyristor of the type described in relation with FIGS. 1A and 1B. The values of the current are indicated as values normalized with respect to their value at 25° C.

Curves 20 and 22 show that the values of currents $I_H$ and $I_{GT}$ decrease as temperature T increases. In particular, at –40° C., the value of $I_{GT}$ is two times greater than at 25° C. and, at 140° C., the value of $I_{GT}$ is approximately two times smaller than at 25° C.

In addition to $I_H$ and to $I_{GT}$, the dI/dt characteristic on switching and the dV/dt turn-on characteristic of a thyristor also depend on the operating temperature.

An SCR-type component having characteristics which remain as constant as possible over the entire operating temperature range of the component is needed.

SUMMARY

Thus, an embodiment provides an SCR-type component of vertical structure having a main upper electrode formed on a silicon region of a first conductivity type, itself formed in a silicon layer of the second conductivity type, wherein said region is interrupted: in first areas where the material of said layer comes into contact with said electrode, and in second areas made of resistive porous silicon extending between said layer and said electrode.

According to an embodiment, the thickness of the second porous silicon areas is greater than the thickness of the region.

According to an embodiment, the resistivity at 25° C. of the porous silicon is in the range from $10^3$ to $10_4$ Ω·cm.

According to an embodiment, the first areas and the second areas are regularly distributed across the surface of the region.

According to an embodiment, the number of first areas is identical to the number of second areas.

An embodiment provides a method of manufacturing porous silicon areas in an SCR-type component with a well, comprising the successive steps of: providing a semiconductor structure comprising a silicon region of a first conductivity type formed in a silicon layer of the second conductivity type, said region being interrupted in areas, the structure being laterally delimited by a peripheral silicon wall of the second conductivity type; depositing a masking layer on the upper surface of the structure by leaving said areas and the upper surface of the peripheral wall exposed; plunging the assembly in electrolytic baths, a first bath being in contact with the upper surface of the structure, a second bath being in contact with the lower surface of the structure, a positive electrode and a negative electrode being respectively plunged into the second bath and into the first bath; and applying a voltage between the positive electrode and the negative electrode to have a current flow in the peripheral wall, a portion of the current flowing in said layer and the areas to form porous silicon in said areas.

According to an embodiment, the electrolytic baths are made of a mixture comprising water, hydrofluoric acid, ethanol, or acetic acid.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the various drawings and, further, as usual in the representation of electronic components, the various drawings are not to scale.

DETAILED DESCRIPTION

Figure 3A:
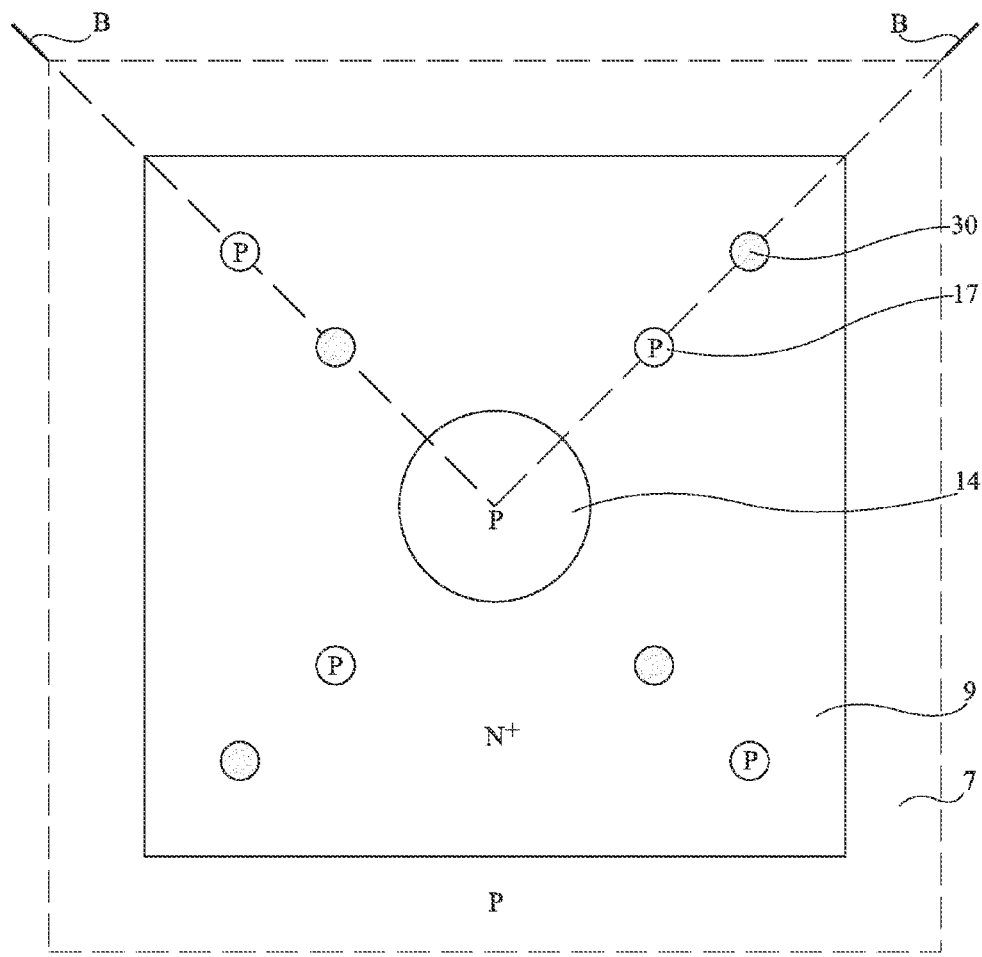
Figure 3B:
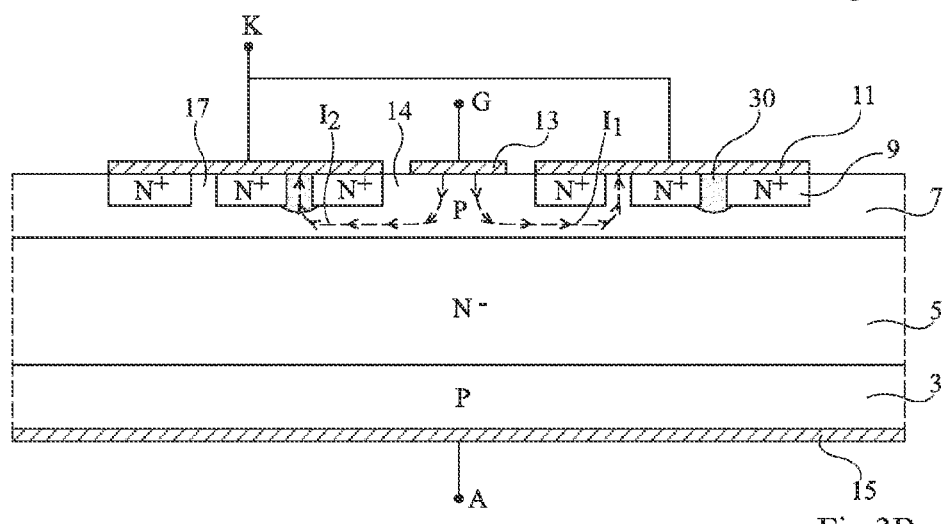

FIGS. 3A and 3B respectively are a top view and a simplified cross-section view of an embodiment of a thyristor. FIG. 3B is a cross-section view along broken line B-B of FIG. 3A. In FIGS. 3A and 3B, the same elements are designated with the same reference numerals as in FIGS. 1A and 1B.

Figure 1A:
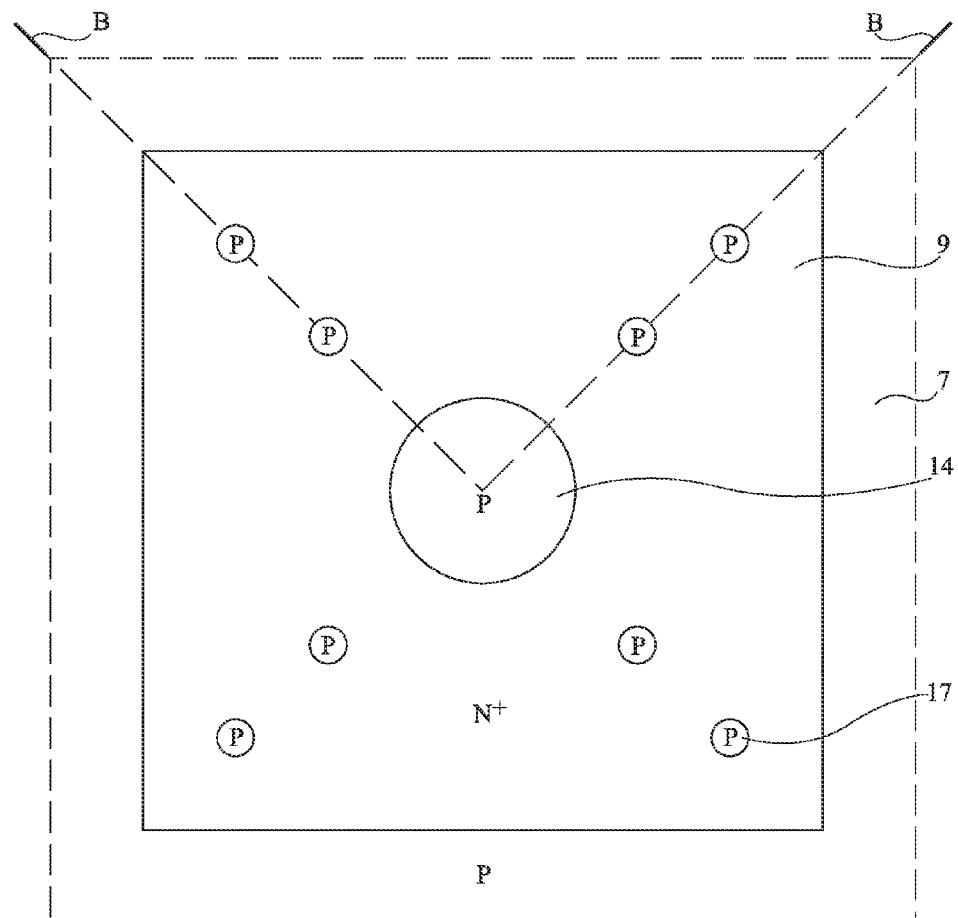
FIGS. 1A and 1B, previously described, respectively are a top view and a cross-section view of an example of thyristor, FIG. 2, previously described, shows the temperature dependence of currents $I_{GT}$ and $I_H$ in a thyristor, FIGS. 3A and 3B respectively are a top view and a cross-section view of an embodiment of a thyristor.
Figure 1B:
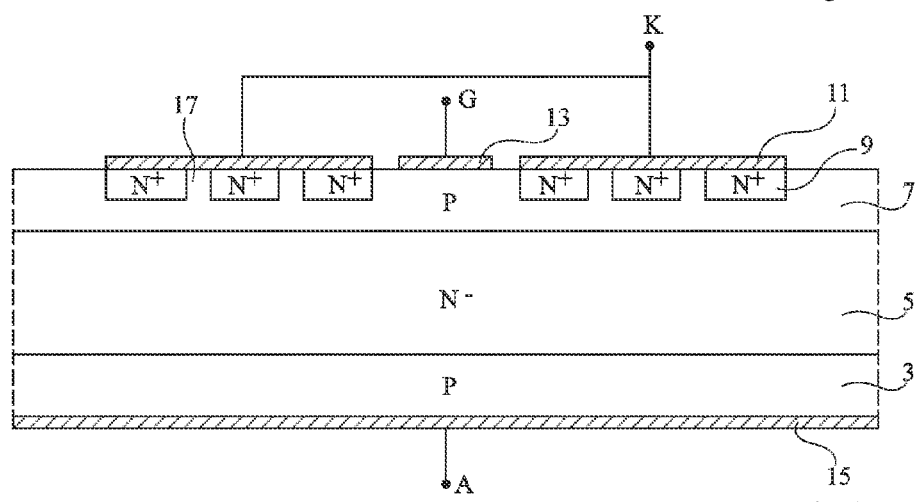

In the thyristor of FIGS. 1A and 1B, emitter short-circuits 17 are formed by the material of layer 7, which is P-type doped silicon. However, in the thyristor illustrated in FIGS. 3A and 3B, some of the emitter short-circuits 17 (previously made of P-type doped silicon, FIG. 1B) are instead formed with emitter short-circuits, referred to as 30, that are made of slightly-conductive porous silicon. The porous silicon of emitter short-circuits 30 extends from cathode metallization 11 into layer 7, preferably through the entire thickness of region 9, and may partly extend below the region 9 in region 7. In particular, the porous silicon of emitter short-circuits 30 is resistive to enable a current to flow there-through between cathode metallization 11 and layer 7. As an example, the resistivity at 25° C. of the porous silicon of emitter short-circuits 30 is selected in a range from $10^3$ to $10^4$ Ω·cm.

In the described embodiment, there are the same number of silicon emitter short-circuits 17 and of porous silicon emitter short-circuits 30. Emitter short-circuits 17 and 30 may be regularly arranged across the surface of region 9. For example, there is a same number of silicon emitter short-circuits 17 and of porous silicon emitter short-circuits 30 at each given distance from the center of region 9.

As an example, in a technological process enabling integrated power components such as thyristors to be made of silicon, the thicknesses of the different layers and/or regions could be:

from 5 to 20 μm, for example 10 μm, for region 9,
from 10 to 30 μm, for example 20 μm, for layers 3 and 7, and
from 50 to 100 μm, for example 70 μm, for layer 5.

The doping concentrations could for example be:
in the range from $10^{14}$ to $10^{16}$ at./cm$^3$ for lightly-doped N-type layer 5 (N$^-$),
in the order of $10^{20}$ at./cm$^3$ for heavily-doped N-type region 9 (N$^+$), and
in the range from $5.10^{17}$ to $5.10^{18}$ at./cm$^3$ for P-type doped regions 3 and 7.

Figure 4:
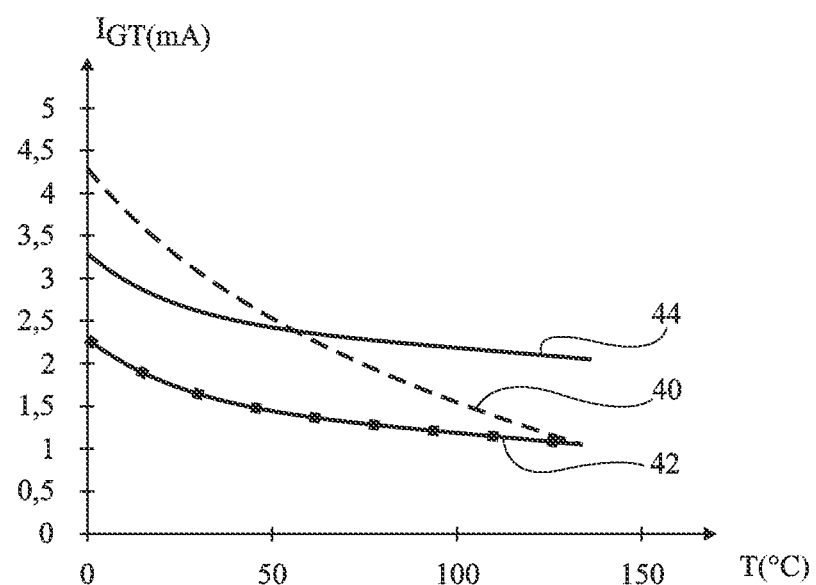
FIG. 4 shows the variation of current $I_{GT}$ according to temperature in different thyristors.

FIG. 4 shows the temperature dependence of current IGT in different thyristors.

Figure 2:
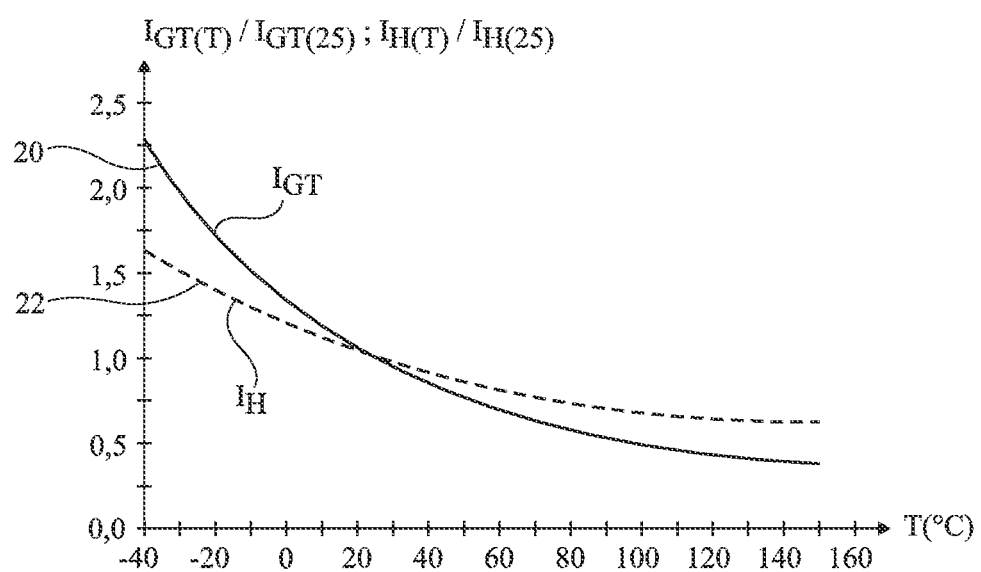

A curve 40 illustrates the variation of current IGT according to temperature for a thyristor of the type described in relation with FIGS. 1A and 1B. In such a thyristor comprising silicon emitter short-circuits 17, as already discussed in relation with FIG. 2, current $I_{GT}$ decreases significantly as the temperature increases. In the considered example, current $I_{GT}$ has a value of 4.4 mA at 0° C.; to be compared with 1 mA only at 140° C.

Curve 42 illustrates the temperature dependence of current $I^{GT}$ in a thyristor of same dimensions and doping levels as the thyristor corresponding to curve 40, but comprising porous silicon emitter short-circuits 30. Current $I^{GT}$ is 2.3 mA at 0° C. and 1 mA at 140° C.

Curve 44 illustrates the temperature dependence of current $I^{GT}$ in a thyristor similar to the thyristor corresponding to curve 42, but where the thickness of region 9 has been decreased. Current $I^{GT}$ is 3.3 mA at 0° C. and 2 mA at 140° C.

These curves show that porous silicon emitter short-circuits 30 associated with silicon emitter short-circuits 17 provide a more stable value of current $I_{GT}$ over the thyristor operating temperature range. For example, in curve 40, current $I_{GT}$ decreases by a ratio 4.3 between 0° C. and 140° C. while for curves 42 and 44, this ratio is 2.3 and 1.6 only, respectively.

Current $I_{GT}$ of a thyristor is inversely proportional to the value of resistance $R_{GK}$ between gate metallization 13 and cathode metallization 11. With emitter short-circuits 17 only, the value of resistance $R_{GK}$ is mainly dependent on the resistivity of the doped silicon of layer 7. Since the resistivity of silicon depends significantly on the temperature and increases as the temperature increases, resistance $R_{GK}$ increases with temperature and it can be understood that the value of current $I_{GT}$ decreases with temperature.

In the thyristor of FIGS. 3A and 3B, resistance $R_{GK}$ depends not only on the resistivity of the P-type doped silicon but also on the resistivity of the resistive porous silicon of emitter short-circuits 30. At least in the operating temperature range of the thyristor, which may be between −40 and 150° C., conversely to the resistivity of single-crystal silicon, the resistivity of the porous silicon decreases as the temperature increases. The resistivity of these two materials varying in opposite manner when the temperature varies, resistance $R_{GK}$ and current $I_{GT}$ are less temperature-dependent.

Referring to FIG. 3B, a current path $I_1$ from gate metallization 13 to cathode metallization 11, on the right-hand side of the drawing, through a single-crystal silicon emitter short-circuit 17, and a current path $I_2$ from gate metallization 13 to cathode metallization 11, on the left-hand side of the drawing, through a porous silicon emitter short-circuit 30, are considered. Total gate current $I_{GT}$ is shared between paths $I_1$ and $I_2$ and becomes less temperature-dependent.

Further, although porous silicon emitter short-circuits 30 associated with doped silicon emitter short-circuits 17 improve the temperature stability of current $I_{GT}$, porous silicon emitter short-circuits 30 also improve the temperature stability of hold current $I_H$, of the dV/dt turning-on, and of the switching dI/dt of an SCR-type component, for example, of a thyristor.

Figure 5A:
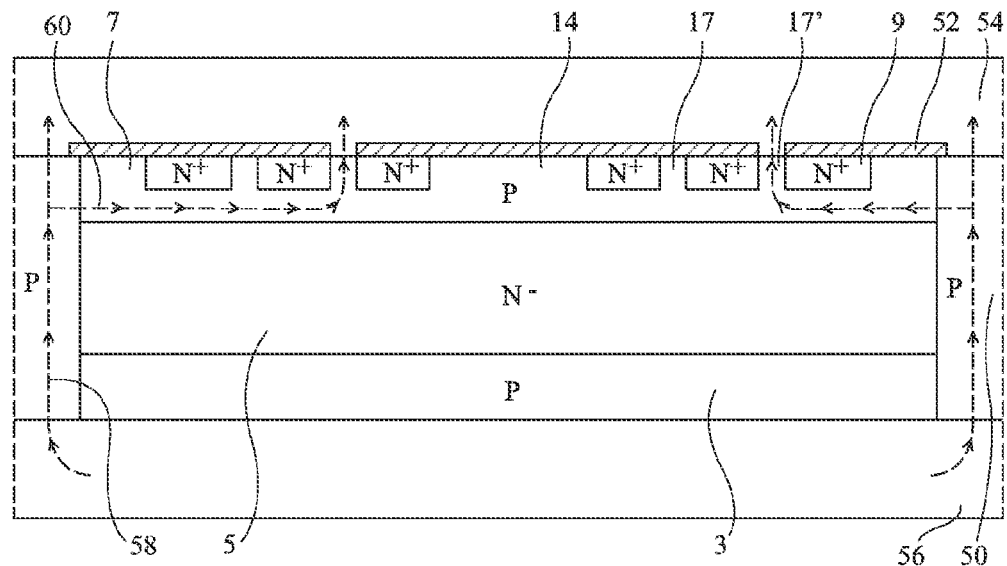
FIGS. 5A and 5B are cross-section views illustrating a method of manufacturing porous silicon areas.
Figure 5B:
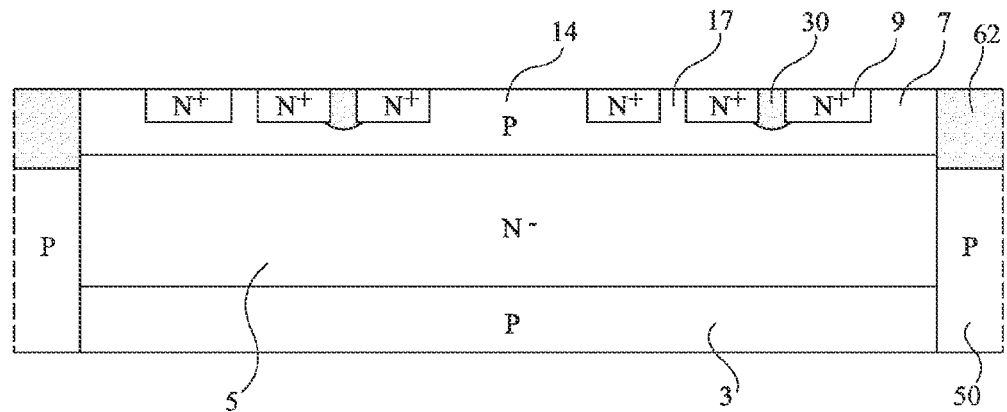

FIGS. 5A and 5B are cross-section views illustrating an embodiment of a method of manufacturing porous silicon areas in an SCR component, such as a thyristor, with emitter short-circuits. The thyristor is of the type having a well, laterally delimited by a P-type doped peripheral wall 50.

FIG. 5A shows a thyristor structure comprising a stack of four semiconductor regions and/or layers 3, 5, 7, and 9 having alternated conductivity types, respectively PNPN, such as described in relation with FIGS. 1A, 1B, 3A, and 3B.

Heavily-doped N-type region 9 (N$^+$) is interrupted in a central portion 14 and in areas 17 and 17'. In areas 17 and 17', the material of P-type doped layer 7 comes into contact with the upper surface of the structure.

An electrically-insulating masking layer 52 covers the entire upper surface of the structure except for peripheral wall 50 and for areas 17'. As an example, layer 52 may be made of Si$_3$N$_4$.

Electrolytic baths 54 and 56 are respectively in contact with the upper surface and with the lower surface of the thyristor. A positive electrode and a negative electrode area are respectively plunged into bath 56 and into bath 54. As an example, electrolytic baths 54 and 56 may be made of a mixture comprising water, hydrofluoric acid, ethanol, or acetic acid.

When a voltage is applied between the positive and negative electrodes, a current 58 flows from the positive electrode to the negative electrode through bath 56, lateral region 50, and bath 54.

Since areas 17' are not covered with masking layer 52, a portion 60 of current 58 flows through layer 7 and areas 17'.

FIG. 5B shows the thyristor obtained after treatment. A porous silicon insulating region 62 has been formed in the upper portion of peripheral wall 50 during the flowing of current 58. Region 62 extends in the entire upper portion of wall 50 and may have a thickness greater than that of layer 7.

During the flowing of portion 60 of current 58 in areas 17', resistive porous silicon 30 has been formed from the upper surface of the thyristor all the way to layer 7, through the entire thickness of region 9, and may partly extend into layer 7.

The thickness, the resistivity, and the porosity of the porous silicon of emitter short-circuits 30 may be adjusted by those skilled in the art by selecting the nature and the concentration of the electrolytic baths, the value of current 58, the current flow time and the doping layer of layer 7. Porous silicon area 62 will be more resistive than regions 30 if a doping level smaller than that of layer 7 is selected for wall 50, for example, respectively from $10^{16}$ to $10^{17}$ at./cm$^3$ and more than $10^{18}$ at./cm$^3$.

Specific embodiments have been described. Various alterations, modifications, and improvements will occur to those skilled in the art. In particular, although in the above-described embodiment, the thyristor comprises eight emitter short-circuit holes, this number may vary and be smaller or much greater.

Further, although embodiments where the number of silicon emitter short-circuits 17 is the same as the number as porous silicon emitter short-circuits 30, the ratio of the number of porous silicon emitter short-circuits 30 to the number of silicon emitter short-circuits 17 may be different from 1.

In the previously-described embodiments, a structure having a central gate has been shown. The embodiments can apply to other gate configurations, and even, as will be seen hereafter, to gateless structures.

Finally, although the advantage of porous silicon emitter short-circuits in SCR-type components to obtain temperature-stable characteristics has only been illustrated on a thyristor-type component, the emitter short-circuits may easily be adapted by those skilled in the art for any type of SCR component, for example, triacs or uni- or bidirectional Shockley diodes, with the same results on the temperature stability of the characteristics of the components. In bidirectional components, symmetrical structures comprising emitter short-circuits of the two previously-described types on each of their surfaces may be provided.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A silicon-controlled rectifier (SCR) type component of vertical structure, comprising:
    a silicon region of a first conductivity type formed in a silicon layer of a second conductivity type;
    a main upper electrode formed on the silicon region of the first conductivity type,
    wherein said silicon region of the first conductivity type is interrupted by:
        first areas formed by the material of said silicon layer of the second conductivity type which are in contact with said main upper electrode, and
        second areas formed by resistive porous silicon which are also in contact with said main upper electrode and extend between said silicon layer and said main upper electrode, the second areas having a thickness that is greater than a thickness of the silicon region of the first conductivity type.

2. The component of claim 1, wherein a resistivity at 25° C. of the second areas formed by resistive porous silicon is in the range from 103 to 104 Ω·cm.

3. The component of claim 1, wherein the first areas and the second areas are regularly distributed across the surface of the silicon region.

4. The component of claim 1, wherein a number of first areas is identical to a number of second areas.

5. A method, comprising:
    forming a silicon region of a first conductivity type in a silicon layer of a second conductivity type, wherein said silicon region is interrupted in areas;
    forming a peripheral silicon wall of the second conductivity type;
    depositing a masking layer on an upper surface, said masking layer including openings which expose at least one of said interrupted areas and the peripheral wall;
    plunging in a first electrolytic bath contacting the upper surface;
    plunging in a second electrolytic bath contacting a lower surface opposite the upper surface;
    wherein both plungings include a positive electrode and a negative electrode; and
    applying a voltage between the positive electrode and the negative electrode to have a current flow in the peripheral wall, with a portion of the current flowing in said silicon layer and through said areas to convert the silicon layer in said interrupted areas to a resistive porous silicon region.

6. The method of claim 5, wherein the first and second electrolytic baths are made of a mixture comprising water, hydrofluoric acid, ethanol, or acetic acid.

7. An integrated component, comprising:
    a multi-layer semiconductor substrate including a top semiconductor layer having a first conductivity type and having an upper surface;
    a region formed in the top semiconductor layer having a second conductivity type, said region extending into the top semiconductor layer from the upper surface;
    emitter-short circuit regions formed in said region of the second conductivity type, said emitter-short circuit regions comprising:
        a plurality first emitter-short circuit regions comprising portions of the top semiconductor layer which extend into first openings within the region of the second conductivity type; and
        a plurality of second emitter-short circuit regions comprising porous silicon which extend into second openings within the region of the second conductivity type to a depth sufficient to contact the top semiconductor layer.

8. The integrated component of claim 7, wherein a thickness of the plurality of second emitter-short circuit regions comprising porous silicon is greater than a thickness of the region having the second conductivity type.

9. The integrated component of claim 7, wherein a resistivity at 25° C. of the porous silicon is in the range from 103 to 104 Ω·cm.

10. The integrated component of claim 7, further comprising:
    a first electrode formed on the upper surface and in contact with the region having the second conductivity type and both the first and second emitter-short circuit regions;
    a second electrode formed on the upper surface and in contact with only the top semiconductor layer; and
    a third electrode formed on a bottom surface of the multi-layer semiconductor substrate.

11. The integrated component of claim 10, wherein the integrated component is of a silicon-controlled rectifier (SCR) type.

12. The integrated component of claim 7, further comprising a peripheral structure formed of:
    a porous silicon region laterally adjacent the top semiconductor layer; and
    an underlying region of the first conductivity type.

* * * * *